US006617674B2

(12) United States Patent
Becker et al.

(10) Patent No.: US 6,617,674 B2
(45) Date of Patent: Sep. 9, 2003

(54) SEMICONDUCTOR PACKAGE AND METHOD OF PREPARING SAME

(75) Inventors: Gregory Scott Becker, Sanford, MI (US); Geoffrey Bruce Gardner, Sanford, MI (US); Brian Robert Harkness, Midland, MI (US); Louise Ann Malenfant, Midland, MI (US); Satyendra Kumar Sarmah, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 09/789,083

(22) Filed: Feb. 20, 2001

(65) Prior Publication Data

US 2002/0158317 A1 Oct. 31, 2002

(51) Int. Cl.[7] .................. H01L 23/02; H01L 23/48; H01L 21/48; H01L 21/44; H01L 21/30
(52) U.S. Cl. ............... 257/678; 257/700; 257/758; 257/738; 257/701; 257/620; 257/618; 257/784; 257/773; 257/780; 438/106; 438/127; 438/125; 438/460; 438/612; 438/613; 438/614
(58) Field of Search .................. 257/678, 700, 257/701, 758, 620, 618, 619, 784, 759, 773, 787, 774, 780; 438/612, 613, 614, 106, 127, 125, 460

(56) References Cited

U.S. PATENT DOCUMENTS

| 3,723,497 A | 3/1973 | Baney ............... 260/46.5 |
|---|---|---|
| 4,064,027 A | 12/1977 | Gant ................. 204/159.13 |
| 4,939,065 A | 7/1990 | Cavezzan et al. ....... 430/167 |
| 5,008,733 A | 4/1991 | Mine et al. ........... 357/72 |
| 5,045,918 A | 9/1991 | Cagan et al. .......... 357/72 |
| 5,145,886 A | 9/1992 | Oxman et al. ......... 522/66 |
| 5,171,716 A | 12/1992 | Cagan et al. ......... 437/211 |
| 5,547,808 A | 8/1996 | Watanabe ............. 430/176 |
| 5,554,465 A | 9/1996 | Watanabe ............. 430/5 |
| 5,678,301 A | * 10/1997 | Gochnour et al. ....... 257/69 |
| 5,685,885 A | * 11/1997 | Khandros et al. ....... 29/841 |
| 6,103,552 A | 8/2000 | Lin .................... 438/113 |
| 6,284,563 B1 | 9/2001 | Fjelstad ............. 438/106 |
| 6,433,440 B1 | * 8/2002 | Ogino et al. .......... 257/784 |
| 2002/0063332 A1 | * 5/2002 | Yamaguchi et al. ...... 257/738 |
| 2002/0094671 A1 | * 7/2002 | Distefano et al. ...... 438/612 |
| 2002/0115236 A1 | * 8/2002 | Fjelstad et al. ....... 438/125 |
| 2003/0027373 A1 | * 2/2003 | DiStefano et al. ...... 438/106 |

FOREIGN PATENT DOCUMENTS

| DE | 2736499 | 2/1979 | ........... B05D/5/08 |
|---|---|---|---|
| GB | 1369989 | 10/1974 | ........... C08G/47/06 |

OTHER PUBLICATIONS

In–Soo Kang et al., 2000 Electronic Components and Technology Conference, pp. 87–92.
A.J.G. Strandjord et al., 1997 IEMT/IMC Symposium, pp. 261–266.
H. Krassow et al., Sensor and Actuators 82 (2000), pp. 229–233.
Jay W. Grate et al., Chemical Innovation, Nov. 2000, vol. 30, No. 11, pp. 29–37.

* cited by examiner

Primary Examiner—Alexander O. Williams
(74) Attorney, Agent, or Firm—Larry A. Milco; Catherine U. Brown

(57) ABSTRACT

A semiconductor package comprising a wafer having an active surface comprising at least one integrated circuit, wherein each integrated circuit has a plurality of bond pads; and a cured silicone layer covering the surface of the wafer, provided at least a portion of each bond pad is not covered with the silicone layer and wherein the silicone layer is prepare by the method of the invention.

30 Claims, 4 Drawing Sheets

SEMICONDUCTOR PACKAGE AND METHOD OF PREPARING SAME

FIELD OF THE INVENTION

The present invention relates to a semiconductor package and more particularly to a wafer-level semiconductor package containing a cured silicone layer. The present invention also relates to a method of preparing the semiconductor package.

BACKGROUND OF THE INVENTION

Integrated circuit (IC) chips or dice are commonly packaged before assembly on a printed wiring board (PWB). The package has several important functions, including interconnection (power and signal transmission), mechanical and environmental protection, and heat dissipation. In addition, the package acts as a mechanism for "spreading apart" the connections from the tight pitch (center to center spacing between bond pads) on the IC chip to the relatively wide pitch required by the printed circuit board manufacturer.

In the highly competitive market of electronic packaging, factors of performance, throughput, cost, and reliability have a major influence on packaging technologies. Although packaging is usually performed on individual IC chips, there is growing interest in developing methods of packaging ICs at the wafer level, (i.e., before singulation of individual chips from the wafer). Wafer-level packaging can potentially achieve higher throughput, higher reliability, and lower costs than individual chip packaging.

The reliability of IC packages is often limited by failure of the interconnect elements (e.g., solder joints, bond wires) between the die and the package substrate or between the package and the PWB. Because such failures are often due to differences in coefficients of thermal expansion (CTE) between the silicon die, the substrate, and the PWB materials, various approaches to minimizing thermally induced stresses in semiconductor packages have been reported. For example, U.S. Pat. No. 5,171,716 to Cagan et al. discloses a semiconductor device containing a stress-relief layer having a glass transition temperature below 150° C.

Kang et al. teach a wafer-level chip scale package containing a high CTE/modulus dielectric polymer as a stress buffer layer (Electronic Components and Technology Conference Proceedings, 2000, 87–92).

Strandjord et al. teach a one mask process for stress-buffer and passivation applications using photosensitive benzocyclobutene (IEMT/IMC Symposium Proceedings, 1997, 261–266).

U.S. Pat. No. 6,103,552 discloses a process and a package for wafer-scale packaging. The process includes depositing a layer of a polymeric material, such as polyimide, silicone elastomer, or benzocyclobutene on the surface of a chip. The '552 patent further teaches that the temperature coefficient of expansion of the polymer should be low so as to match that of the metal studs in the package, thereby minimizing local stresses at the stud-polymer interface.

Although the aforementioned approaches to semiconductor packaging provide packages having a range of thermal properties, there is a continued need for a semiconductor package having superior thermal stability.

SUMMARY OF THE INVENTION

The present invention is directed to a semiconductor package comprising:
a semiconductor wafer having an active surface comprising at least one integrated circuit, wherein each integrated circuit has a plurality of bond pads; and
a cured silicone layer covering the active surface, provided at least a portion of each bond pad is not covered by the silicone layer and wherein the silicone layer is prepared by a method comprising the steps of:
(i) applying a silicone composition to the active surface to form a film, wherein the silicone composition comprises:
(A) an organopolysiloxane containing an average of at least two silicon-bonded alkenyl groups per molecule,
(B) an organosilicon compound containing an average of at least two silicon-bonded hydrogen atoms per molecule in a concentration sufficient to cure the composition, and
(C) a catalytic amount of a photoactivated hydrosilylation catalyst;
(ii) exposing a portion of the film to radiation having a wavelength of from 150 to 800 nm to produce a partially exposed film having non-exposed regions covering at least a portion of each bond pad and exposed regions covering the remainder of the active surface;
(iii) heating the partially exposed film for an amount of time such that the exposed regions are substantially insoluble in a developing solvent and the non-exposed regions are soluble in the developing solvent;
(iv) removing the non-exposed regions of the heated film with the developing solvent to form a patterned film; and
(v) heating the patterned film for an amount of time sufficient to form the cured silicone layer.

The present invention is further directed to a method of preparing a semiconductor package, the method comprising the steps of:
(i) applying a silicone composition to an active surface of a semiconductor wafer to form a film, wherein the active surface comprises at least one integrated circuit, each integrated circuit has a plurality of bond pads, and the silicone composition comprises:
(A) an organopolysiloxane containing an average of at least two silicon-bonded alkenyl groups per molecule,
(B) an organosilicon compound containing an average of at least two silicon-bonded hydrogen atoms per molecule in a concentration sufficient to cure the composition, and
(C) a catalytic amount of a photoactivated hydrosilylation catalyst;
(ii) exposing a portion of the film to radiation having a wavelength of from 150 to 800 nm to produce a partially exposed film having non-exposed regions covering at least a portion of each bond pad and exposed regions covering the remainder of the active surface;
(iii) heating the partially exposed film for an amount of time such that the exposed regions are substantially insoluble in a developing solvent and the non-exposed regions are soluble in the developing solvent;
(iv) removing the non-exposed regions of the heated film with the developing solvent to form a patterned film; and (v) heating the patterned film for an amount of time sufficient to form a cured silicone layer.

The semiconductor package of the present invention exhibits good thermal stability over a wide range of temperatures and good environmental resistance. Also, the semiconductor package permits simultaneous testing of all ICs on a wafer. Moreover, individual chips can be singulated (separated) from the wafer-level semiconductor package, with each chip having a size only slightly larger than the IC itself. These "chip scale packages", which are lighter, smaller, and thinner than conventional IC packages, are ideally suited for high-density applications.

The method of preparing the semiconductor package of the present invention is scaleable to a high throughput manufacturing process. Importantly, the method provides simultaneous packaging of all ICs on a wafer. Additionally, the method employs conventional wafer fabrication techniques (e.g., coating, exposing, developing, curing) and equipment. Furthermore, the method uses a photopatternable silicone composition, thereby eliminating additional process steps associated with use of a non-photopatternable polymer composition. Finally, the process of the instant invention has high resolution, meaning that the process transfers images from a photomask to the silicone layer on a wafer with good retention of critical dimensions.

The semiconductor package of the present invention can be used to prepare individual IC chip packages. The chip packages are useful for fabricating printed wiring boards, which can be incorporated into electronic equipment, such as calculators, telephones, televisions, and mainframe and personal computers.

These and other features, aspects, and advantages of the present invention will become better understood with reference to the following description, appended claims, and accompanying drawings.

DETAILED DESCRIPTION OF THE INVENTION

Figure 1:
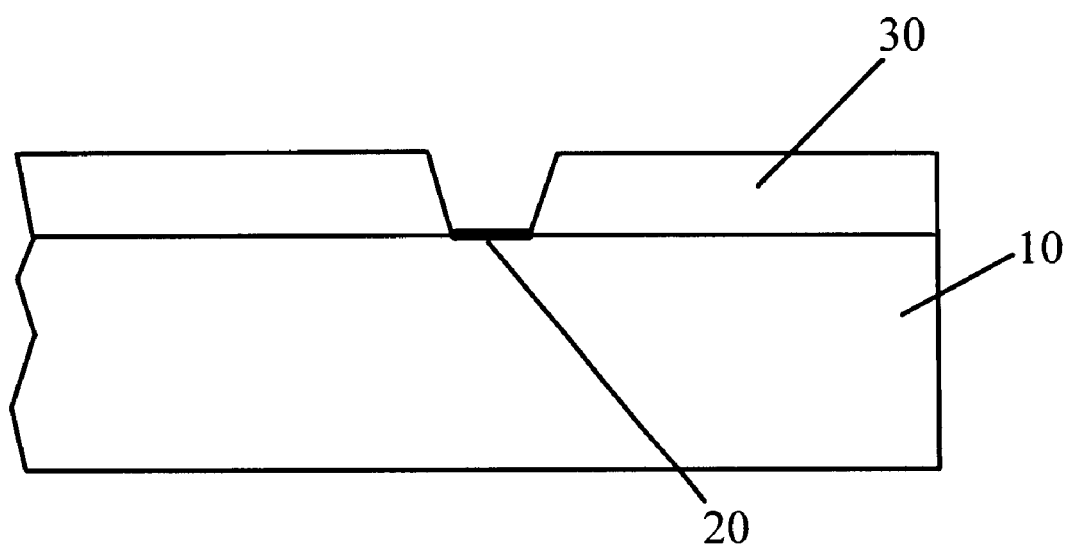
FIG. 1 shows a cross-sectional view of a semiconductor package according to the present invention.

A semiconductor package according to the present invention is shown in FIG. 1. For clarity, only a portion of a wafer having a single bond pad is shown. The semiconductor package comprises a semiconductor wafer 10 having an active surface comprising at least one integrated circuit (not shown), wherein each integrated circuit has a plurality of bond pads 20; and a cured silicone layer 30 covering the active surface of the wafer, provided at least a portion of each bond pad is not covered with the silicone layer.

The semiconductor wafer 10 comprises a semiconductor material such as silicon and gallium arsenide. The active surface of the semiconductor wafer comprises at least one, typically more than 100 ICs. Examples of ICs include, but are not limited to, DRAM, FLASH, SRAM, and LOGIC devices. Each IC has a plurality of bond pads 20 (i.e., I/O terminals), usually located on the periphery of the IC. The number of bond pads 20 per integrated circuit can range from about 4 to about 2,000, depending on the complexity of the circuit. The bond pads 20 are made of an electrically conductive metal, typically aluminum, copper, or alloys thereof. Preferably, the semiconductor wafer 10 further comprises streets or scribe lines, along which the wafer can be sawed into individual chips. Methods of fabricating integrated circuits on semiconductor wafers are well known in the art.

The thickness of the cured silicone layer 30 is typically from 0.1 to 200 $\mu$m, preferably from 1 to 50 $\mu$m, and more preferably from 5 to 25 $\mu$m. The cured silicone layer 30 is prepared using a silicone composition comprising (A) an organopolysiloxane containing an average of at least two silicon-bonded alkenyl groups per molecule, (B) an organosilicon compound containing an average of at least two silicon-bonded hydrogen atoms per molecule in a concentration sufficient to cure the composition, and (C) a catalytic amount of a photoactivated hydrosilylation catalyst.

Component (A) is at least one organopolysiloxane containing an average of at least two silicon-bonded alkenyl groups per molecule. The organopolysiloxane can have a linear, branched, or resinous structure. The organopolysiloxane can be a homopolymer or a copolymer. The alkenyl groups typically have from 2 to about 10 carbon atoms and are exemplified by, but not limited to, vinyl, allyl, butenyl, and hexenyl. The alkenyl groups in the organopolysiloxane may be located at terminal, pendant, or both terminal and pendant positions. The remaining silicon-bonded organic groups in the organopolysiloxane are independently selected from monovalent hydrocarbon and monovalent halogenated hydrocarbon groups free of aliphatic unsaturation. These monovalent groups typically have from 1 to about 20 carbon atoms, preferably have from 1 to 10 carbon atoms, and are exemplified by, but not limited to alkyl such as methyl, ethyl, propyl, pentyl, octyl, undecyl, and octadecyl; cycloalkyl such as cylcohexyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. Preferably, at least 50 percent, and more preferably at least 80%, of the organic groups free of aliphatic unsaturation in the organopolysiloxane are methyl.

The viscosity of the organopolysiloxane at 25° C., which varies with molecular weight and structure, is typically from 0.001 to 100,000 Pa.s, preferably from 0.01 to 10,000 Pa.s, and more preferably from 0.01 to 1,000 Pa.s.

Examples of organopolysiloxanes useful in the silicone composition include, but are not limited to, polydiorganosiloxanes having the following formulae:

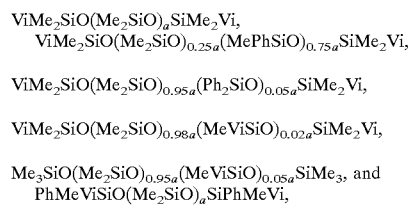

where Me, Vi, and Ph denote methyl, vinyl, and phenyl respectively and a has a value such that the viscosity of the polydiorganosiloxane is from 0.001 to 100,000 Pa.s.

Methods of preparing organopolysiloxanes suitable for use in the silicone composition, such as hydrolysis and condensation of the corresponding organohalosilanes or equilibration of cyclic polydiorganosiloxanes, are well known in the art.

Examples of organopolysiloxane resins include an MQ resin consisting essentially of $R^1_3SiO_{1/2}$ units and $SiO_{4/2}$ units, a TD resins consisting essentially of $R^1SiO_{3/2}$ units and $R^1_2SiO_{2/2}$ units, an MT resin consisting essentially of $R^1_3SiO_{1/2}$ units and $R^1SiO_{3/2}$ units, and an MTD resin consisting essentially of $R^1_3SiO_{1/2}$ units, $R^1SiO_{3/2}$ units, and $R^1_2SiO_{2/2}$ units, wherein each $R^1$ is independently selected from monovalent hydrocarbon and monovalent halogenated hydrocarbon groups. The monovalent groups represented by $R^1$ typically have from 1 to about 20 carbon atoms and preferably have from 1 to about 10 carbon atoms. Examples of monovalent groups include, but are not limited to, alkyl such as methyl, ethyl, propyl, pentyl, octyl, undecyl, and octadecyl; cycloalkyl such as cylcohexyl; alkenyl such as vinyl, allyl, butenyl, and hexenyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. Preferably, at least one-third, and more preferably substantially all $R^1$ groups in the organopolysiloxane resin are methyl. A preferred organopolysiloxane resin consists essentially of $(CH_3)_3SiO_{1/2}$ siloxane units and $SiO_{4/2}$ wherein the mole ratio of $(CH_3)_3SiO_{1/2}$ units to $SiO_{4/2}$ units is from 0.6 to 1.9.

Preferably, the organopolysiloxane resin contains an average of from about 3 to 30 mole percent of alkenyl groups. The mole percent of alkenyl groups in the resin is defined here as the ratio of the number of moles of alkenyl-containing siloxane units in the resin to the total number of moles of siloxane units in the resin, multiplied by 100.

The organopolysiloxane resin can be prepared by methods well-known in the art. Preferably, the resin is prepared by treating a resin copolymer produced by the silica hydrosol capping process of Daudt et al. with at least an alkenyl-containing endblocking reagent. The method of Daudt et al, is disclosed in U.S. Pat. No. 2,676,182, which is hereby incorporated by reference to teach how to make organopolysiloxane resins suitable for use in the present invention.

Briefly stated, the method of Daudt et al. involves reacting a silica hydrosol under acidic conditions with a hydrolyzable triorganosilane such as trimethylchlorosilane, a siloxane such as hexamethyldisiloxane, or mixtures thereof, and recovering a copolymer having M and Q units. The resulting copolymers generally contain from about 2 to about 5 percent by weight of hydroxyl groups.

The organopolysiloxane resin, which typically contains less than 2 percent by weight of silicon-bonded hydroxyl groups, can be prepared by reacting the product of Daudt et al. with an alkenyl-containing endblocking agent or a mixture of an alkenyl-containing endblocking agent and an endblocking agent free of aliphatic unsaturation in an amount sufficient to provide from 3 to 30 mole percent of alkenyl groups in the final product. Examples of endblocking agents include, but are not limited to, silazanes, siloxanes, and silanes. Suitable endblocking agents are known in the art and exemplified in U.S. Pat. No. 4,584,355 to Blizzard et al.; U.S. Pat No. 4,591,622 to Blizzard et al.; and U.S. Pat. No. 4,585,836 to Homan et al.; which are hereby incorporated by reference. A single endblocking agent or a mixture of such agents can be used to prepare the organopolysiloxane resin.

Component (A) can be a single organopolysiloxane or a mixture comprising two or more organopolysiloxanes that differ in at least one of the following properties: structure, viscosity, average molecular weight, siloxane units, and sequence.

Component (B) is at least one organosilicon compound containing an average of at least two silicon-bonded hydrogen atoms per molecule. It is generally understood that crosslinking occurs when the sum of the average number of alkenyl groups per molecule in component (A) and the average number of silicon-bonded hydrogen atoms per molecule in component (B) is greater than four. The silicon-bonded hydrogen atoms in the organohydrogenpolysiloxane can be located at terminal, pendant, or at both terminal and pendant positions.

The organosilicon compound can be an organosilane or an organohydrogensiloxane. The organosilane can be a monosilane, disilane, trisilane, or polysilane. Similarly, the organohydrogensiloxane can be a disiloxane, trisiloxane, or polysiloxane. Preferably, the organosilicon compound is an organohydrogensiloxane and more preferably, the organosilicon compound is an organohydrogenpolysiloxane. The structure of the organosilicon compound can be linear, branched, cyclic, or resinous. Preferably, at least 50 percent of the organic groups in the organosilicon compound are methyl.

Examples of organosilanes include, but are not limited to, monosilanes such as diphenylsilane and 2-chloroethylsilane; disilanes such as 1,4-bis(dimethylsilyl)benzene, bis[(p-dimethylsilyl)phenyl]ether, and 1,4-dimethyldisilylethane; trisilanes such as 1,3,5-tris(dimethylsilyl)benzene and 1,3,5-trimethyl-1,3,5-trisilane; and polysilanes such as poly(methylsilylene)phenylene and poly(methylsilylene) methylene.

Examples of organohydrogensiloxanes include, but are not limited to, disiloxanes such as 1,1,3,3-tetramethyldisiloxane and 1,1,3,3-tetraphenyldisiloxane; trisiloxanes such as phenyltris(dimethylsiloxy)silane and 1,3,5-trimethylcyclotrisiloxane; and polysiloxanes such as a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a resin consisting essentially of $H(CH_3)_2SiO_{1/2}$ units, $(CH_3)_3SiO_{1/2}$ units, and $SiO_{4/2}$ units.

Component (B) can be a single organosilicon compound or a mixture comprising two or more such compounds that differ in at least one of the following properties: structure, average molecular weight, viscosity, silane units, siloxane units, and sequence.

The concentration of component (B) in the silicone composition of the present invention is sufficient to cure (crosslink) the composition. The exact amount of component (B) depends on the desired extent of cure, which generally increases as the ratio of the number of moles of silicon-bonded hydrogen atoms in component (B) to the number of moles of alkenyl groups in component (A) increases. Typically, the concentration of component (B) is sufficient to provide from 0.5 to 3 silicon-bonded hydrogen atoms per alkenyl group in component (A). Preferably, the concentration of component (B) is sufficient to provide from 0.7 to 1.2 silicon-bonded hydrogen atoms per alkenyl group in component (A).

Methods of preparing organosilicon compounds containing silicon-bonded hydrogen atoms are well known in the art. For example, organopolysilanes can be prepared by reaction of chlorosilanes in a hydrocarbon solvent in the presence of sodium or lithium metal (Wurtz reaction). Organopolysiloxanes can be prepared by hydrolysis and condensation of organohalosilanes.

To ensure compatibility of components (A) and (B), the predominant organic group in each component is preferably the same. Preferably this group is methyl.

Component (C) is a photoactivated hydrosilylation catalyst. The photoactivated hydrosilylation catalyst can be any hydrosilylation catalyst capable of catalyzing the hydrosilylation of component (A) with component (B) upon exposure to radiation having a wavelength of from 150 to 800 nm and subsequent heating. The platinum group metals include platinum, rhodium, ruthenium, palladium, osmium and iridium. Preferably, the platinum group metal is platinum, based on its high activity in hydrosilylation reactions. The suitability of particular photoactivated hydrosilylation catalyst for use in the silicone composition of the present invention can be readily determined by routine experimentation using the methods in the Examples section below.

Examples of photoactivated hydrosilylation catalysts include, but are not limited to, platinum(II) β-diketonate complexes such as platinum(II) bis(2,4-pentanedioate), platinum(II) bis(2,4-hexanedioate), platinum(II) bis(2,4-heptanedioate), platinum(II) bis(1-phenyl-1,3-butanedioate, platinum(II) bis(1,3-diphenyl-1,3-propanedioate), platinum (II) bis(1,1,1,5,5,5-hexafluoro-2,4-pentanedioate); (η-cyclopentadienyl)trialkylplatinum complexes, such as (Cp)trimethylplatinum, (Cp)ethyldimethylplatinum, (Cp) triethylplatinum, (chloro-Cp)trimethylplatinum, and (trimethylsilyl-Cp)trimethylplatinum, where Cp represents cyclopentadienyl; triazene oxide-transition metal complexes, such as $Pt[C_6H_5NNNOCH_3]_4$, $Pt[p-CN-C_6H_4NNNOC_6H_{11}]_4$, $Pt[p-H_3COC_6H_4NNNOC_6H_{11}]_4$, $Pt[p-CH_3(CH_2)_x-C_6H_4NNNOCH_3]_4$, 1,5-cyclooctadiene.Pt $[p-CN-C_6H_4NNNOC_6H_{11}]_2$, 1,5-cyclooctadiene.Pt$[p-CH_3O-C_6H_4NNNOCH_3]_2$, $[(C_6H_5)_3P]_3Rh[p-CN-C_6H_4NNNOC_6H_{11}]$, and $Pd[p-CH_3(CH_2)_x-C_6H_4NNNOCH_3]_2$, where x is 1, 3, 5, 11, or 17; (η-diolefin) (σ-aryl)platinum complexes, such as ($\eta^4$-1,5-cyclooctadienyl)diphenylplatinum, $\eta^4$-1,3,5,7-cyclooctatetraenyl)diphenylplatinum, ($\eta^4$-2,5-norboradienyl)diphenylplatinum, ($\eta^4$-1,5-cyclooctadienyl)bis-(4-dimethylaminophenyl)platinum, ($\eta^4$-1,5-cyclooctadienyl)bis-(4-acetylphenyl)platinum, and ($\eta^4$-1,5-cyclooctadienyl)bis-(4-trifluormethylphenyl)platinum. Preferably, the photoactivated hydrosilylation catalyst is a Pt(II) β-diketonate complex and more preferably the catalyst is platinum(II) bis(2,4-pentanedioate).

Component (C) can be a single photoactivated hydrosilylation catalyst or a mixture comprising two or more such catalysts.

The concentration of component (C) is sufficient to catalyze the addition reaction of components (A) and (B) upon exposure to radiation and heat in the method described below. The concentration of component (C) is sufficient to provide typically from 0.1 to 1000 ppm of platinum group metal, preferably from 0.5 to 100 ppm of platinum group metal, and more preferably from 1 to 25 ppm of platinum group metal, based on the combined weight of components (A), (B), and (C). The rate of cure is very slow below 1 ppm of platinum group metal. The use of more than 100 ppm of platinum group metal results in no appreciable increase in cure rate, and is therefore uneconomical.

Methods of preparing the preceding photoactivated hydrosilylation catalysts are well known in the art. For example, methods of preparing platinum(II) β-diketonates are reported by Guo et al. (Chemistry of Materials, 1998, 10, 531–536). Methods of preparing (η-cyclopentadienyl) trialkylplatinum complexes are disclosed in U.S. Pat. No. 4,510,094. Methods of preparing triazene oxide-transition metal complexes are disclosed in U.S. Pat. No. 5,496,961. And, methods of preparing (η-diolefin)(σ-aryl) platinum complexes are taught in U.S. Pat. No. 4,530,879.

Mixtures of the aforementioned components (A), (B), and (C) may begin to cure at ambient temperature. To obtain a longer working time or "pot life", the activity of the catalyst under ambient conditions can be retarded or suppressed by the addition of a suitable inhibitor to the silicone composition of the present invention. A platinum catalyst inhibitor retards curing of the present silicone composition at ambient temperature, but does not prevent the composition from curing at elevated temperatures. Suitable platinum catalyst inhibitors include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-phenyl-3-butyn-2-ol; maleates and fumarates, such as the well known dialkyl, dialkenyl, and dialkoxyalkyl fumarates and maleates; and cyclovinylsiloxanes. Acetylenic alcohols constitute a preferred class of inhibitors in the silicone composition of the present invention.

The concentration of platinum catalyst inhibitor in the present silicone composition is sufficient to retard curing of the composition at ambient temperature without preventing or excessively prolonging cure at elevated temperatures. This concentration will vary widely depending on the particular inhibitor used, the nature and concentration of the hydrosilylation catalyst, and the nature of the organohydrogenpolysiloxane.

Inhibitor concentrations as low as one mole of inhibitor per mole of platinum group metal will in some instances yield a satisfactory storage stability and cure rate. In other instances, inhibitor concentrations of up to 500 or more moles of inhibitor per mole of platinum group metal may be required. The optimum concentration for a particular inhibitor in a given silicone composition can be readily determined by routine experimentation.

The silicone composition of the present invention can also comprise additional ingredients, provided the ingredient does not adversely affect the photopatterning or cure of the composition in the method of the present invention. Examples of additional ingredients include, but are not limited to, adhesion promoters, solvents, inorganic fillers, photosensitizers, and surfactants.

The silicone composition of the present invention can further comprise an appropriate quantity of at least one organic solvent to lower the viscosity of the composition and facilitate the preparation, handling, and application of the composition. Examples of suitable solvents include, but are not limited to, saturated hydrocarbons having from 1 to about 20 carbon atoms; aromatic hydrocarbons such as xylenes and mesitylene; mineral spirits; halohydrocarbons; esters; ketones; silicone fluids such as linear, branched, and cyclic polydimethylsiloxanes; and mixtures of such solvents. The optimum concentration of a particular solvent in the present silicone composition can be readily determined by routine experimentation.

The silicone composition of the present invention can be a one-part composition comprising components (A) through (C) in a single part or, alternatively, a multi-part composition comprising components (A) through (C) in two or more parts. In a multi-part composition, components (A), (B), and (C) are typically not present in the same part unless an inhibitor is also present. For example, a multi-part silicone composition can comprise a first part containing a portion of component (A) and a portion of component (B) and a second part containing the remaining portion of component (A) and all of component (C).

The one-part silicone composition of the instant invention is typically prepared by combining components (A) through (C) and any optional ingredients in the stated proportions at ambient temperature with or without the aid of a solvent, which is described above. Although the order of addition of the various components is not critical if the silicone composition is to be used immediately, the hydrosilylation catalyst is preferably added last at a temperature below about 30° C. to prevent premature curing of the composition. Also, the multi-part silicone composition of the present invention can be prepared by combining the particular components designated for each part.

Figure 2:
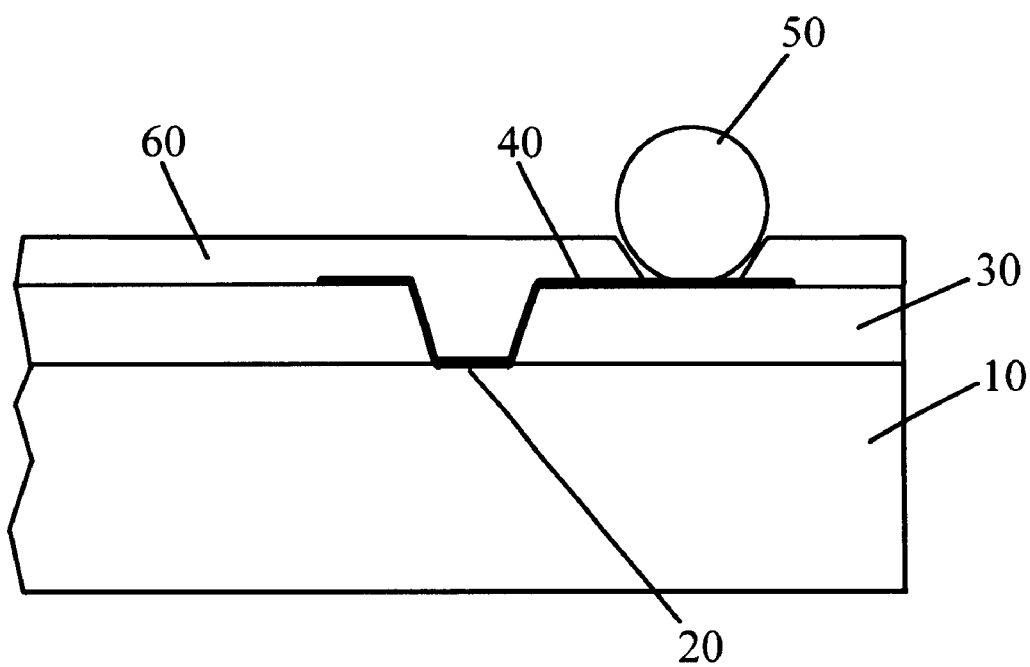
FIG. 2 shows a cross-sectional view of a semiconductor package according to the present further comprising a metal trace attached to each bond pad.

A preferred semiconductor package according to the present invention is shown in FIG. 2. For clarity, only a portion of a wafer having a single bond pad is shown. As shown in FIG. 2, the semiconductor package comprises a semiconductor wafer 10 having an active surface comprising at least one integrated circuit (not shown), wherein each integrated circuit has a plurality of bond pads 20; a cured silicone layer 30 covering the active surface of the wafer except the bond pads 20; a metal trace 40 having a proximal end attached to each bond pad 20 and a distal end lying on the surface of the silicone layer 30; a solder bump 50 attached to the distal end of each trace 40; and a solder mask 60 covering the bond pads 20, silicone layer 30, and metal traces 40.

Figure 3:
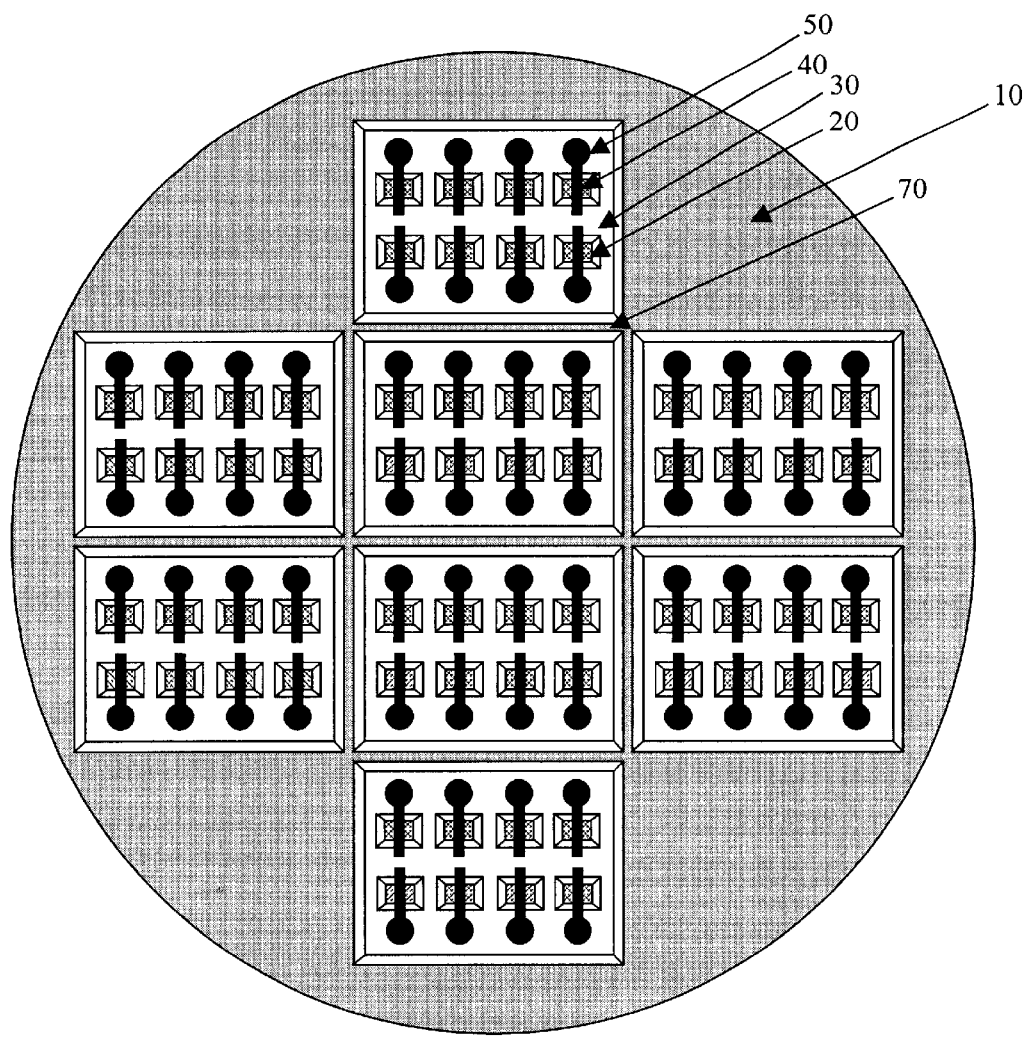
FIG. 3 shows a semiconductor wafer according to this invention.

FIG. 3 shows a semiconductor wafer 10 according to this invention. The wafer 10 has an active surface comprising at least one integrated circuit (not shown), wherein each integrated circuit has a plurality of bond pads 20 on the active surface; a cured silicone layer 30 covering the active surface of the wafer except the bond pads 20; a metal trace 40 having a proximal end attached to each bond pad 20 and a distal end lying on the surface of the silicone layer 30; and a solder bump 50 attached to the distal end of each trace 40. The wafer 10 further comprises streets 70.

Figure 4:
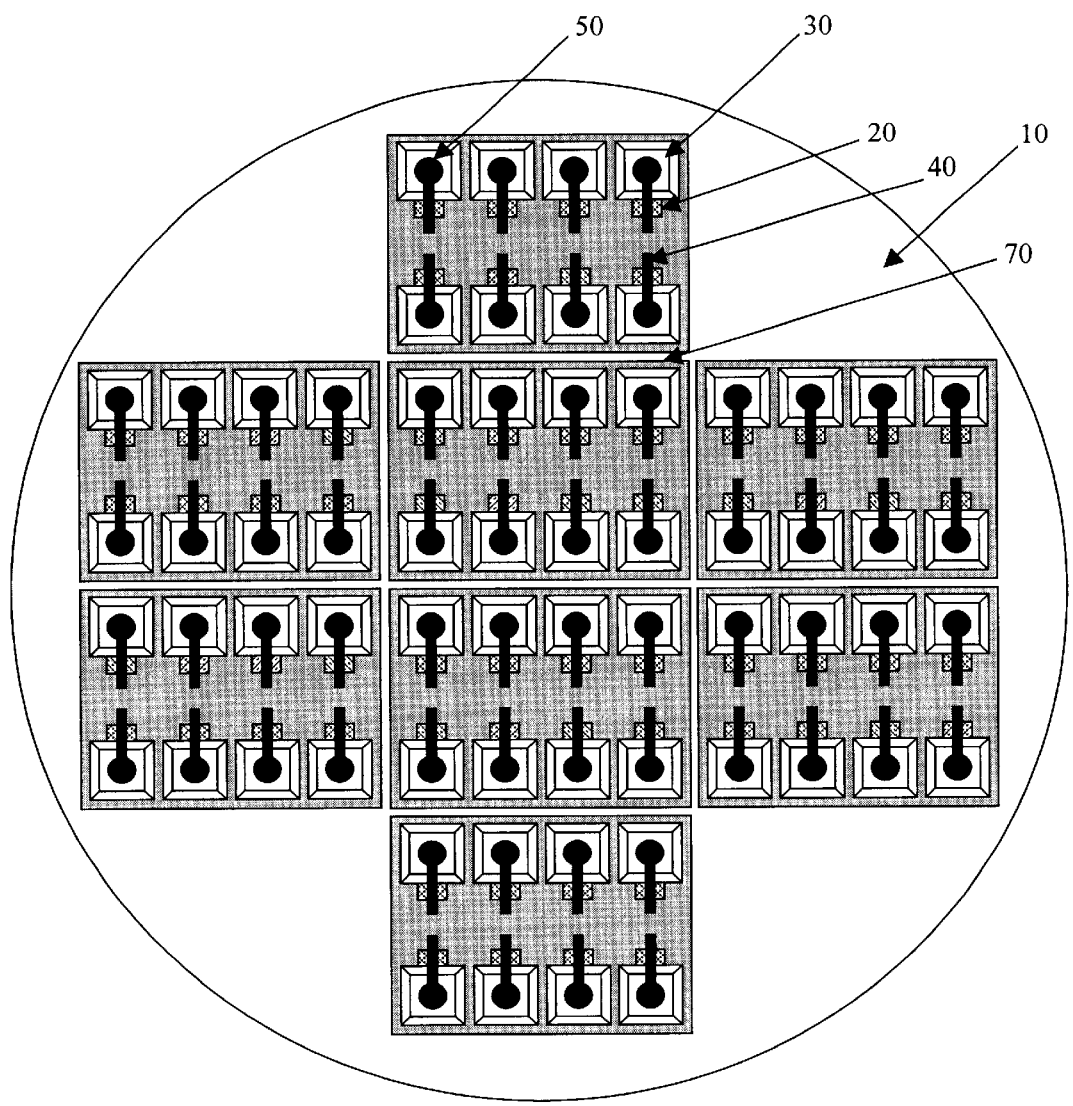
FIG. 4 shows a semiconductor wafer according to this invention.

FIG. 4 shows an alternative semiconductor wafer 10 according to this invention. The wafer 10 has an active surface comprising at least one integrated circuit (not shown), wherein each integrated circuit has a plurality of bond pads 20 on the active surface; a cured silicone layer 30 covering the active surface of the wafer except the bond pads 20; a metal trace 40 having a proximal end attached to each bond pad 20 and a distal end lying on the surface of the silicone layer 30; and a solder bump 50 attached to the distal end of each trace 40. The wafer 10 further comprises streets 70.

The metal traces reroute or redistribute the peripheral bond pads on the ICs to an area array configuration. The traces comprise an electrically conductive metal or alloy. Examples of metals include chromium, titanium, copper, gold, and nickel. Preferably, the metal trace consists of a three-layer system of titanium/nickel/copper, where titanium is the adhesion layer, nickel is a diffusion barrier, and copper is the main trace metal. Preferably, the solder mask is a cured product of the silicone composition of the present invention. The preceding wafer-level package design absent the silicone composition of the present invention is known in the art. For example, Kang et al. report a wafer-level chip-scale package containing a modified polyimide as a stress buffer layer, a solder mask consisting of benzocyclobutene, and a redistribution network consisting of metal runners and solder balls (Electronic Components and Technology Conference Proceedings, 2000, 87–92).

A method of preparing a semiconductor package according to the present invention comprises the steps of:

(i) applying a silicone composition to an active surface of a semiconductor wafer to form a film, wherein the active surface comprises at least one integrated circuit, each integrated circuit has a plurality of bond pads, and the silicone composition comprises:

(A) an organopolysiloxane containing an average of at least two silicon-bonded alkenyl groups per molecule, (B) an organosilicon compound containing an average of at least two silicon-bonded hydrogen atoms per molecule in a concentration sufficient to cure the composition, and (C) a catalytic amount of a photoactivated hydrosilylation catalyst;

(ii) exposing a portion of the film to radiation having a wavelength of from 150 to 800 nm to produce a partially exposed film having non-exposed regions covering at least a portion of each bond pad and exposed regions covering the remainder of the active surface;

(iii) heating the partially exposed film for an amount of time such that the exposed regions are substantially insoluble in a developing solvent and the non-exposed regions are soluble in the developing solvent;

(iv) removing the non-exposed regions of the heated film with the developing solvent to form a patterned film; and (v) heating the patterned film for an amount of time sufficient to form a cured silicone layer.

The silicone composition can be applied to the active surface of the semiconductor wafer using any conventional method, such as spin coating, dipping, spraying, or screen printing. Preferably, the silicone composition is applied by spin coating at a speed of from 500 to 6,000 rpm for 5 to 60 s. The volume of silicone composition applied in the spin coating method is typically from 0.1 to 5 mL. The spin speed, spin time, and volume of silicone composition can be adjusted to produce a cured silicone film (step v) having a thickness of from 0.1 to 200 $\mu$m.

When the silicone composition comprises a solvent, the method can further comprise removing at least a portion of the solvent from the film. Preferably, the solvent is removed by heating the film at a temperature of from 50 to 150° C. for 1 to 5 minutes and more preferably the solvent is removed by heating the film at a temperature of from 80 to 120° C. for 2 to 4 minutes.

A portion of the resulting silicone film is exposed to radiation to produce a partially exposed film having non-exposed regions covering at least a portion of each bond pad and exposed regions covering the remainder of the active surface of the wafer. When the wafer further comprises scribe lines, the silicone composition overlying the lines is typically not exposed to radiation. The light source typically used is a medium pressure mercury-arc lamp. The wavelength of the radiation is typically from 150 to 800 nm and preferably from 250 to 450 nm. The dose of radiation is typically from 0.1 to 5,000 mJ/cm$^2$ and preferably from 250 to 1,300 mJ/cm$^2$. Selected regions of the film are exposed to the radiation through a photomask having a pattern of images.

The partially exposed film is heated for an amount of time such that the regions that were exposed to radiation ("exposed regions") are substantially insoluble in a developing solvent. The regions that were not previously exposed to radiation ("non-exposed regions") are soluble in the developing solvent. The term "substantially insoluble" means that the exposed regions of the silicone film are not removed by dissolution in a developing solvent to the extent that the underlying active surface of the wafer is exposed. The term "soluble" means that the unexposed regions of the silicone film are removed by dissolution in a developing solvent, exposing the underlying active surface of the wafer. The partially exposed film is typically heated at a temperature of from 50 to 250° C. for 0.1 to 10 minutes, preferably heated at a temperature of from 100 to 200° C. for 1 to 5 minutes, and more preferably heated at a temperature of from 135 to 165° C. for 2 to 4 minutes. The partially exposed film can be heated using conventional equipment such as a hot plate or oven.

The non-exposed regions of the heated film are removed with a developing solvent to form a patterned film. The developing solvent is an organic solvent in which the non-exposed regions of the heated film are at least partially soluble and the exposed regions are essentially insoluble. The developing solvent typically has from 3 to 20 carbon atoms. Examples of developing solvents include ketones, such as methyl isobutyl ketone and methyl pentyl ketone; ethers, such as n-butyl ether and polyethylene glycol monomethylether; esters, such as ethyl acetate and y-butyrolactone; aliphatic hydrocarbons, such as nonane, decalin, and dodecane; and aromatic hydrocarbons, such as mesitylene, xylene, and toluene. The developing solvent can be applied by any conventional method, including spraying, immersion, and pooling. Preferably, the developing solvent is applied by forming a pool of the solvent on a stationary wafer and then spin-drying the wafer. The developing solvent is typically used at a temperature of from room temperature to 100° C. However, the specific temperature will depend on the chemical properties of the solvent, the boiling point of the solvent, the desired rate of pattern formation, and the requisite resolution of the photopatterning process.

The patterned film is then heated for an amount of time sufficient to form a cured silicone layer. Typically, the patterned film is heated for an amount to achieve maximum crosslink density in the silicone without oxidation or decomposition. The patterned film is typically heated at a temperature of from 50 to 300° C. for 1 to 300 minutes, preferably heated at a temperature of from 75 to 275° C. for 10 to 120 minutes, and more preferably heated at a temperature of from 200 to 250° C. for 20 to 60 minutes. The patterned film can be heated using conventional equipment such as a hot plate or oven.

In a preferred embodiment of the present method (see FIG. 2), the process further comprises forming a metal trace 40 having a proximal end attached to each bond pad 20 and a distal end lying on the surface of the silicone layer 30; applying a solder mask 60 covering the bond pads 20, silicone layer 30, and metal traces 40, wherein at least a potion of the distal end of each trace 40 is free of the solder mask 60; and forming a solder bump 50 on the distal end of each trace 40. The resulting semiconductor package can be separated into individual IC chips using, for example, a conventional wafer saw.

The metal traces can be formed using conventional sputtering, lithography, and electroplating techniques as reported, for example, by Kang et al. (Electronic Components and Technology Conference, 2000, 87–92). Preferably, the solder mask is formed by applying the silicone composition of the present invention to the surface of the package and photopatterning the composition to produce openings for solder bumps over the distal ends of the metal traces.

Alternatively, the process can further comprise attaching a spring contact to each bond pad and separating the package into individual IC chips. Examples of spring contacts and methods of attaching spring contacts to semiconductor devices are known in the art, as exemplified in U.S. Pat. No. 6,168,974B1 to Chang et al.

Conversely, the process can further comprise separating the package into individual IC chips and assembling each chip into a leadframe package. The assembly process typically includes attaching each chip to a leadframe, connecting (usually wire bonding) the bond pads on each chip to the leads on the leadframe, and sealing the parts of the housing together or encapsulating the assembly with a molding compound. Methods of assembling leadframe packages, such as DIP, SH-DIP, SK-DIP, SL-DIP, SIP, ZIP, PGA, SO, SOP, LCC, PLCC, and SOJ, are well known in the art.

On the other hand, the process can further comprise separating the package into individual IC chips and assembling each chip into a Ball Grid Array (BGA) package. Methods of assembling BGA packages are also well known in the art.

A patterned film can also be produced by applying the silicone composition to a surface of a substrate to form a film, exposing a portion of the film to radiation having a wavelength of from 150 to 800 nm to produce a partially exposed film having non-exposed regions covering a portion of the surface and exposed regions covering the remainder of the surface, heating the partially exposed film for an amount of time such that the exposed regions are substantially insoluble in a developing solvent and the non-exposed regions are soluble in the developing solvent, removing the non-exposed regions of the heated film with the developing solvent to form a patterned film, and heating the patterned film for an amount of time sufficient to form a cured silicone layer. Suitable substrates include, but are not limited to, metals such as aluminum, silver, copper, and iron, and their alloys; silicon; porous materials such as paper, wood, leather, and fabrics; polyolefins, such as polyethylene and polypropylene; fluorocarbon polymers such as polytetrafluoroethylene and polyvinylfluoride; polystyrene; polyamides such as Nylon; polyimides; polyesters and acrylic polymers; painted surfaces; ceramics; glass; and glass cloth.

The semiconductor package of the present invention exhibits good thermal stability over a wide range of temperatures and good environmental resistance. Moreover, the semiconductor package of the present invention can be separated into individual chips, each having a size only slightly larger than the IC itself. These "chip scale packages", which are lighter, smaller, and thinner than conventional IC packages, are ideally suited for high-density applications.

The method of preparing the semiconductor package of the present invention is scaleable to a high throughput manufacturing process. Importantly, the method provides simultaneous packaging of all ICs on a wafer. Additionally, the method employs conventional wafer fabrication techniques (e.g., coating, exposing, developing, curing) and equipment. Furthermore, the method uses a photopatternable silicone composition, thereby eliminating additional process steps associated with use of a non-photopatternable polymer composition. Finally, the process of the instant invention has high resolution, meaning that the process transfers images from a photomask to the silicone layer on a wafer with good retention of critical dimensions.

The semiconductor package of the present invention can be used to prepare individual IC chip packages. The chip packages are useful for fabricating printed wiring boards, which can be incorporated into electronic equipment, such as calculators, telephones, televisions, and mainframe and personal computers.

EXAMPLES

The following examples are presented to further illustrate the method of photopatterning the silicone composition of this invention, but are not to be considered as limiting the invention, which is delineated in the appended claims. Unless otherwise noted, all parts and percentages reported in the examples are by weight. The following methods and materials were employed in the examples:

Irradiation of a silicone film was carried out using a OAI 7-inch medium pressure mercury projection lamp equipped with a 4-inch diameter interference filter centered at 365±2 nm (I-line) and having a half-height peak width of 10±2 nm (Optics Automation Instrumentation, Milpitas, Calif.). Radiation dose (mJ/cm$^2$) was measured using an International Light radiometer calibrated against I-line radiation.

Thickness of a cured silicone film on a silicon wafer was determined using a Tencor P-11 surface profilometer (KLA Tencor, Milpitas, Calif.). Film thickness was measured at a step between the coated and uncoated surfaces of the wafer. The reported value for thickness, expressed in units of microns, represents the average of three measurements performed on different regions of the same wafer.

Film retention, expressed as percentage, was calculated according to the equation:

$$\text{Film retention } (\%) = t_2/t_1 \times 100$$

where $t_2$ is the thickness of a cured patterned silicone film produced according to the method in the Examples below and $t_1$ is the thickness of a silicone film prepared using the same method, except omitting the steps of UV exposure, post-exposure heating, and developing (treatment with n-butyl ether). In the latter case, a portion of the unpatterned cured silicone film was removed to expose the wafer surface. Thickness measurements were carried out as described above.

Resolution of the photopatterning process was determined by measuring the size of a feature in the silicone film corresponding to a 250-micron circular aperture (Examples 1–3) or a 40-micron circular aperture (Examples 4–33) in the photomask. Measurements were performed on a digitized photomicrograph of the via using Image Pro Plus image analysis software (Silver Spring, Md.). The reported value for resolution, expressed in units of microns, represents the average of four measurements performed on different features of the same wafer.

Resin: an organopolysiloxane resin consisting essentially of $CH_2=CH(CH_3)_2SiO_{1/2}$ units, $(CH_3)_3SiO_{1/2}$ units, and $SiO_{4/2}$ units, wherein the mole ratio of $CH_2=CH(CH_3)_2SiO_{1/2}$ units and $(CH_3)_3SiO_{1/2}$ units combined to $SiO_{4/2}$ units is about 0.7, and the resin has a weight-average molecular weight of about 22,000, a polydispersity of about 5, and contains about 5.5 mole percent (1.8% by weight) of vinyl groups.

Crosslinking Agent: a mixture consisting of 88% of a trimethylsiloxy-terminated poly(dimethylsiloxane/methylhydrogensiloxane) having an average of 92 dimethylsiloxane units and 6 methylhydrogensiloxane units and per molecule and containing about 0.08% of silicon-bonded hydrogen atoms; 4% of dimethyl methylhydrogen cyclosiloxane; 4% of octamethylcyclotetrasiloxane; 3% of decamethylcyclopentasiloxane; and 1% of dimethylcyclosiloxanes ($D_6$ or greater);

Silicone Base: a mixture consisting of 61.32% of Resin; 22.09% of a mixture consisting of 88% of a trimethylsiloxy-terminated poly(dimethylsiloxane/methylhydrogensiloxane) having an average of 100 dimethylsiloxane units and 9 methylhydrogensiloxane units per molecule and containing about 0.11% of silicon-bonded hydrogen atoms, 5% of dimethyl methylhydrogen cyclosiloxane, 3% of octamethylcyclotetrasiloxane, 2% of decamethylpentasiloxane, 1% of methylhydrogen cyclosiloxanes, and 0.8% of dimethylcyclosiloxanes ($D_6$ or greater); 2.33% of a trimethylsiloxy-terminated poly (dimethylsiloxane/methylhydrogensiloxane) having an average of 3 dimethylsiloxane units and 5 methylhydrogensiloxane units per molecule and containing about 0.8% of silicon-bonded hydrogen atoms; and 14.27% of mesitylene. The Silicone Base was stored in a sealed amber bottle.

The platinum(II) acetylacetonate used to prepare Catalysts A–E was obtained from Strem Chemicals (Newburyport, Mass.). The material was purified by sublimation at a temperature of 140° C. and a pressure of 4 mmHg.

Catalyst A: a mixture consisting of 0.05% of platinum(II) acetylacetonate in mesitylene.

Catalyst B: a mixture consisting of 0.10% of platinum(II) acetylacetonate in mesitylene.

Catalyst C: a mixture consisting of 0.15% of platinum(II) acetylacetonate in mesitylene.

Catalyst D: a mixture consisting of 0.20% of platinum(II) acetylacetonate in mesitylene.

Catalyst E: a mixture consisting of 0.25% of platinum(II) acetylacetonate in mesitylene.

Mesitylene: A.C.S. reagent grade.

Examples 1–3

Resin (46.84 parts), 42.16 parts of Crosslinking Agent, and 10.12 parts of mesitylene were combined in an amber bottle. Catalyst D (0.89 part) was added to the blend and mixing was continued for 0.5 h at room temperature. The mixture was then pressure-filtered (138 to 276 kPa nitrogen) through a stainless steel canister containing 10-$\mu$m and 5-$\mu$m nylon membranes in series. The silicone composition (filtrate) was stored prior to use at −15° C. in a closed polyethylene bottle wrapped in aluminum foil.

In each of Examples 1–3, the silicone composition (about 2.5 g), which was at room temperature, was applied to a 100-mm silicon wafer and spun out into a thin film (500 rpm for 10 s followed by 3000 rpm for 30 s). The coated wafer was heated on a hot plate at 110° C. for 2 minutes to remove most of the solvent. The film was then exposed to I-line radiation (365 nm) through a photomask containing 250-$\mu$m circular apertures and in near contact with the film. The wafer was then heated on a hot plate under the conditions of temperature and time specified in Table 1. The wafer was allowed to cool to room temperature and mounted on a spin coater. The coated surface of the wafer was flooded with nonane and allowed to stand at room temperature for two minutes. The wafer was then spun dry (500 rpm for 10 s followed by 3000 rpm for 30 s), placed in an oven for thirty minutes at 250° C., and allowed to cool to room temperature. The film thickness, film retention, and resolution values for each wafer are reported in Table 1.

TABLE 1

| Example | Catalyst | Dose (mJ/cm$^2$) | Post. UV Temp. (° C.) | Bake Time (s) | Film Thickness ($\mu$m) | Film Retention (%) | Resolution ($\mu$m) |
| --- | --- | --- | --- | --- | --- | --- | --- |
| 1 | D | 1000 | 135 | 180 | 18.3 | 87 | 151 |
| 2 | D | 1000 | 144 | 265 | 16.8 | 80 | 168 |
| 3 | D | 1000 | 165 | 60 | 17.2 | 82 | 164 |

Examples 4–33

In each of Examples 4–34, a silicone composition was prepared by combining the a silicone base with the Catalyst specified in Table 2 according to the following procedure: Silicone Base (99.15 parts) and 0.85 part of Catalyst were combined in an amber bottle and mixed for 0.5 h at room temperature. The mixture was then pressure-filtered (138 to 276 kPa nitrogen) through a stainless steel canister containing 10-$\mu$m and 5-$\mu$m nylon membranes in series. The silicone composition (filtrate) was stored prior to use at −15° C. in a closed polyethylene bottle wrapped in aluminum foil.

A sample of the silicone composition (about 2.5 g), which was at temperature, was applied to a 100-mm silicon wafer and spun out into a thin film (500 rpm for 10 s followed by 3000 rpm for 30 s). The coated wafer was heated on a hot plate at 110° C. for 2 minutes to remove most of the solvent. The film was then exposed to I-line radiation (365 nm) through a photomask containing 40-$\mu$m circular apertures and in near contact with the film. The wafer was then heated on a hot plate under the conditions of temperature and time specified in Table 2. The wafer was allowed to cool to room temperature and mounted on a spin coater. The coated surface of the wafer was flooded with n-butyl ether and allowed to stand at room temperature for two minutes. The wafer was then spun dry (500 rpm for 10 s followed by 3000 rpm for 30 s), placed in an oven for thirty minutes at 250° C., and allowed to cool to room temperature. The film thickness, film retention, and resolution values for each wafer are reported in Table 2.

TABLE 2

| Example | Catalyst | Dose (mJ/cm$^2$) | Post. UV Temp. (° C.) | Bake Time (s) | Film Thickness (μm) | Film Retention (%) | Resolution (μm) |
| --- | --- | --- | --- | --- | --- | --- | --- |
| 4 | A | 700 | 165 | 180 | 14.33 | 62 | 44.55 |
| 5 | B | 400 | 150 | 120 | 0.17 | 0.7 | — |
| 6 | B | 400 | 150 | 240 | 10.24 | 45 | 46.32 |
| 7 | B | 400 | 180 | 120 | 15.33 | 67 | 40.13 |
| 8 | B | 400 | 180 | 240 | 17.64 | 77 | 15.05 |
| 9 | B | 1000 | 150 | 120 | 12.19 | 53 | 52.15 |
| 10 | B | 1000 | 150 | 240 | 15.74 | 68 | 42.59 |
| 11 | B | 1000 | 180 | 120 | 18.25 | 79 | 25.26 |
| 12 | B | 1000 | 180 | 240 | 18.91 | 82 | 19.99 |
| 13 | C | 100 | 165 | 180 | 6.89 | 30 | — |
| 14 | C | 700 | 135 | 180 | 8.67 | 38 | — |
| 15 | C | 700 | 165 | 60 | 7.61 | 33 | — |
| 16 | C | 700 | 165 | 180 | 8.19 | 36 | — |
| 17 | C | 700 | 165 | 180 | 16.62 | 72 | 37.55 |
| 18 | C | 700 | 165 | 180 | 16.64 | 72 | 19.50 |
| 19 | C | 700 | 165 | 180 | 17.31 | 75 | + |
| 20 | C | 700 | 165 | 180 | 17.69 | 77 | 17.72 |
| 21 | C | 700 | 165 | 180 | 18.08 | 79 | 32.97 |
| 22 | C | 700 | 165 | 300 | 19.12 | 83 | 33.22 |
| 23 | C | 700 | 195 | 180 | 25.00 | 100 | 6.02 |
| 24 | C | 1300 | 165 | 180 | 18.43 | 80 | 27.78 |
| 25 | D | 400 | 150 | 120 | 12.12 | 53 | 47.59 |
| 26 | D | 400 | 150 | 240 | 16.02 | 70 | 39.89 |
| 27 | D | 400 | 180 | 120 | 19.10 | 83 | 32.99 |
| 28 | D | 400 | 180 | 240 | 25.00 | 100 | 8.43 |
| 29 | D | 1000 | 150 | 120 | 16.32 | 71 | 43.30 |
| 30 | D | 1000 | 150 | 240 | 18.82 | 82 | 23.53 |
| 31 | D | 1000 | 180 | 120 | 18.74 | 82 | 19.87 |
| 22 | D | 1000 | 180 | 240 | 25.00 | 100 | 5.66 |
| 33 | E | 700 | 165 | 180 | 19.07 | 83 | 21.79 |

—Denotes a value not measurable due to poor image quality and + denotes a value not measured.

That which is claimed is:

1. A semiconductor package comprising:
a semiconductor wafer having an active surface comprising a plurality of bond pads; and
a cured silicone layer covering the active surface of the wafer except the bond pads, wherein the silicone layer is prepared by a method comprising the steps of:
  (i) applying a silicone composition to the active surface of the semiconductor wafer to form a film, wherein the active surface comprises a plurality of bond pads, and the silicone composition comprises:
    (A) an organopolysiloxane containing an average of at least two silicon-bonded alkenyl groups per molecule,
    (B) an organosilicon compound containing an average of at least two silicon-bonded hydrogen atoms per molecule in a concentration sufficient to cure the composition, and
    (C) a catalytic amount of a photoactivated hydrosilylation catalyst;
  (ii) exposing a portion of the film to radiation having a wavelength of from 150 to 800 nm to produce a partially exposed film having non-exposed regions covering at least a portion of each bond pad and exposed regions covering the remainder of the active surface;
  (iii) heating the partially exposed film for an amount of time such that the exposed regions are substantially insoluble in a developing solvent and the non-exposed regions are soluble in the developing solvent;
  (iv) removing the non-exposed regions of the heated film with the developing solvent to form a patterned film; and
  (v) heating the patterned film for an amount of time sufficient to form the cured silicone layer.

2. The semiconductor package according to claim 1, wherein the wafer further comprises streets.

3. The semiconductor package according to claim 1, wherein the thickness of the cured silicone layer is from 1 to 50 μm.

4. The semiconductor package according to claim 1, wherein component (A) is an organopolysiloxane resin consisting essentially of $R^1_3SiO_{1/2}$ siloxane units and $SiO_{4/2}$ siloxane units wherein each $R^1$ is independently selected from monovalent hydrocarbon and monovalent halogenated hydrocarbon groups, and the mole ratio of $R^1_3SiO_{1/2}$ units to $SiO_{4/2}$ units in the organopolysiloxane resin is from 0.6 to 1.9.

5. The semiconductor package according to claim 1, wherein component (B) is an organohydrogenpolysiloxane.

6. The semiconductor package according to claim 1, wherein the concentration of component (B) is sufficient to provide from 0.7 to 1.2 silicon-bonded hydrogen atoms per alkenyl group in component (A).

7. The semiconductor package according to claim 1, wherein the photoactivated catalyst is a platinum(II) β-diketonate.

8. The semiconductor package according to claim 7, wherein the platinum(II) β-diketonate is platinum(II) bis(2,4-pentanedioate).

9. The semiconductor package according to claim 1, wherein the silicone composition further comprises an organic solvent.

10. The semiconductor package according to claim 1, further comprising a metal trace having a proximal end attached to each bond pad and a distal end lying on the surface of the silicone layer.

11. A method of preparing a semiconductor package, the method comprising the steps of:

(i) applying a silicone composition to an active surface of a semiconductor wafer to form a film, wherein the active surface comprises a plurality of bond pads, and the silicone composition comprises:
  (A) an organopolysiloxane containing an average of at least two silicon-bonded alkenyl groups per molecule,
  (B) an organosilicon compound containing an average of at least two silicon-bonded hydrogen atoms per molecule in a concentration sufficient to cure the composition, and
  (C) a catalytic amount of a photoactivated hydrosilylation catalyst;
(ii) exposing a portion of the film to radiation having a wavelength of from 150 to 800 nm to produce a partially exposed film having non-exposed regions covering at least a portion of each bond pad and exposed regions covering the remainder of the active surface;
(iii) heating the partially exposed film for an amount of time such that the exposed regions are substantially insoluble in a developing solvent and the non-exposed regions are soluble in the developing solvent;
(iv) removing the non-exposed regions of the heated film with the developing solvent to form a patterned film; and
(v) heating the patterned film for an amount of time sufficient to form a cured silicone layer.

12. The method according to claim 11, wherein the wafer further comprises streets.

13. The method according to claim 11, wherein the thickness of the cured silicone layer is from 1 to 50 $\mu$m.

14. The method according to claim 11, wherein component (A) is an organopolysiloxane resin consisting essentially of $R^1{}_3SiO_{1/2}$ siloxane units and $SiO_{4/2}$ siloxane units wherein each $R^1$ is independently selected from monovalent hydrocarbon and monovalent halogenated hydrocarbon groups, and the mole ratio of $R^1{}_3SiO_{1/2}$ units to $SiO_{4/2}$ units in the organopolysiloxane resin is from 0.6 to 1.9.

15. The method according to claim 11, wherein component (B) is an organohydrogenpolysiloxane.

16. The method according to claim 11, wherein the concentration of component (B) is sufficient to provide from 0.7 to 1.2 silicon-bonded hydrogen atoms per alkenyl group in component (A).

17. The method according to claim 11, wherein the photoactivated catalyst is a platinum(II) β-diketonate.

18. The method according to claim 17, wherein the platinum(II) β-diketonate is platinum(II) bis(2,4-pentanedioate).

19. The method according to claim 11, wherein the step of applying the silicone composition is carried out using spin coating.

20. The method according to claim 11, wherein the silicone composition further comprises a solvent.

21. The method according to claim 20, further comprising, after step (i), the step of removing at least a portion of the solvent from the film.

22. The method according to claim 11, wherein the radiation has a wavelength of from 250 to 450 nm.

23. The method according to claim 11, wherein the step of heating the partially exposed film is carried out at a temperature of from 100 to 200° C. for 1 to 5 minutes.

24. The method according to claim 11, wherein the step of heating the patterned film is carried out at a temperature of from 75 to 275° C. for 10 to 120 minutes.

25. The method according to claim 11, wherein the developing solvent is selected from an ether and an aliphatic hydrocarbon.

26. The method according to claim 11, further comprising the step of forming a metal trace having a proximal end attached to each bond pad and a distal end lying on the surface of the silicone layer.

27. A method of producing a patterned film, the method comprising the steps of:
(i) applying a silicone composition to a surface of a substrate to form a film, wherein the silicone composition comprises:
  (A) an organopolysiloxane containing an average of at least two silicon-bonded alkenyl groups per molecule,
  (B) an organosilicon compound containing an average of at least two silicon-bonded hydrogen atoms per molecule in a concentration sufficient to cure the composition, and
  (C) a catalytic amount of a photoactivated hydrosilylation catalyst;
(ii) exposing a portion of the film to radiation having a wavelength of from 150 to 800 nm to produce a partially exposed film having non-exposed regions covering a portion of the surface and exposed regions covering the remainder of the surface;
(iii) heating the partially exposed film for an amount of time such that the exposed regions are substantially insoluble in a developing solvent and the non-exposed regions are soluble in the developing solvent;
(iv) removing the non-exposed regions of the heated film with the developing solvent to form a patterned film; and
(v) heating the patterned film for an amount of time sufficient to form a cured silicone layer.

28. The semiconductor package according to claim 10, further comprising a solder mask covering the bond pads, the cured silicone layer, and the metal traces; wherein at least a portion of the distal end of each of the traces is free of the solder mask.

29. The semiconductor package according to claim 28, wherein the solder mask is prepared by a method comprising:
(i) applying a second silicone composition to a surface including the bond pads, the cured silicone layer, and the metal traces, to form a mask film; wherein the second silicone composition comprises
  (A) an organopolysiloxane containing an average of at least two silicon-bonded alkenyl groups per molecule,
  (B) an organosilicon compound containing an average of at least two silicon-bonded hydrogen atoms per molecule in a concentration sufficient to cure the composition, and
  (C) a catalytic amount of a photoactivated hydrosilylation catalyst;
(ii) exposing a portion of the mask film to radiation having a wavelength of from 150 to 800 nm to produce a partially exposed film having non-exposed regions covering the distal ends of the metal traces and exposed regions covering the remainder of the surface;
(iii) heating the partially exposed mask film for an amount of time such that the exposed regions are substantially insoluble in the developing solvent and the non-exposed regions are soluble in the developing solvent;
(iv) removing the non-exposed regions of the heated mask film with the developing solvent to form a patterned mask film; and
(v) heating the patterned mask film for an amount of time sufficient to form the solder mask.

30. A semiconductor package comprising:

a semiconductor wafer having an active surface comprising a plurality of bond pads;

a cured silicone layer covering the active surface of the wafer except the bond pads;

a metal trace having a proximal end attached to each bond pad and a distal end lying on the surface of the silicone layer; and a solder mask covering the bond pads, the cured silicone layer, and the metal trace; wherein at least a portion of the distal end of the trace is free of the solder mask; and wherein the solder mask is prepared by a method comprising (i) applying a silicone composition onto a surface including the bond pads, the cured silicone layer, and the metal traces, to form a mask film; wherein the silicone composition comprises (A) an organopolysiloxane containing an average of at least two silicon-bonded alkenyl groups per molecule, (B) an organosilicon compound containing an average of at least two silicon-bonded hydrogen atoms per molecule in a concentration sufficient to cure the composition, and (C) a catalytic amount of a photoactivated hydrosilylation catalyst;

(ii) exposing a portion of the mask film to radiation having a wavelength of from 150 to 800 nm to produce a partially exposed film having non-exposed regions covering the distal ends of the metal traces and exposed regions covering the remainder of the surface;

(iii) heating the partially exposed mask film for an amount of time such that the exposed regions are substantially insoluble in the developing solvent and the non-exposed regions are soluble in the developing solvent;

(iv) removing the non-exposed regions of the heated mask film with the developing solvent to form a patterned mask film; and (v) heating the patterned mask film for an amount of time sufficient to form the solder mask.

* * * * *